(12) United States Patent
Takahashi

(10) Patent No.: US 6,495,889 B1
(45) Date of Patent: Dec. 17, 2002

(54) SEMICONDUCTOR DEVICE HAVING SELF-ALIGNED CONTACTS

(75) Inventor: Akira Takahashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 7 days.

(21) Appl. No.: 09/713,025

(22) Filed: Nov. 16, 2000

(30) Foreign Application Priority Data

May 15, 2000 (JP) ........................................ 2000-141933

(51) Int. Cl.$^7$ ............................................. H01L 29/76
(52) U.S. Cl. ................. 257/382; 257/331; 257/350; 438/303; 438/279; 438/595; 438/586
(58) Field of Search .................. 257/262, 288, 257/327, 331, 332, 350, 390, 336, 344, 408, 382, 383, 384, 385, 900; 438/303, 595, 200, 201, 241, 258, 275, 279, 585, 586, 256, 399, 571, 597

(56) References Cited

U.S. PATENT DOCUMENTS 5,899,721 A * 5/1999 Gardner et al. ............. 438/303
6,245,625 B1 * 6/2001 Gau ............................ 438/305

FOREIGN PATENT DOCUMENTS

JP  10-4190  1/1998

OTHER PUBLICATIONS

Tomohisa Mizuno et al., "Hot–Carrier Injection Suppression Due to the Nitride–Oxide LDD Spacer Structure," IEEE Transactions on Electron Devices, vol. 38, No. 3, Mar. 1991, pp. 584–591.

F.C. Hsu et al., "Structure–Enhanced MOSFET Degradation Due to Hot–Electron Injection," IEEE Electron Device Letters, vol. EDL–5, No. 3, Mar. 1984, pp. 71–74.

* cited by examiner

Primary Examiner—Chandra Chaudhari
Assistant Examiner—Jack Chen
(74) Attorney, Agent, or Firm—Volentine Francos, PLLC

(57) ABSTRACT

A semiconductor device comprises an SAC structure having side wall spacers and offset nitride films. In particular, in this semiconductor device, the side wall spacers are constituted from lower side wall spacers that are composed of silicon oxide films and are in contact with the lower side of the gate electrode side walls, and upper side wall spacers that are composed of silicon nitride films and are in contact with the upper side of the gate electrodes side walls. As a result thereof, a distance is formed between the substrate and the interface between the silicon nitride film and the silicon oxide film. This suppresses the hot carrier phenomenon and the occurrence of poor contact.

11 Claims, 9 Drawing Sheets

SEMICONDUCTOR DEVICE HAVING SELF-ALIGNED CONTACTS

BACKGROUND OF THE INVENTION

1. Field of the Invention

The present invention relates to a semiconductor device and a method for manufacturing the same.

2. Description of Related Art

A self aligned contact (SAC) method has been employed in the pasts to achieve a higher degree of integration in semiconductor devices.

The SAC method is as follows. First, gate electrodes having side wall spacers and offset nitride films (silicon nitride films used for offset) are formed on a substrate. An interlayer insulation film is then formed so as to cover the side wall spacers, offset nitride films, and gate electrodes. After this, contact holes are formed at self-aligning positions utilizing the etching selectivity of the side wall spacers, the offset nitride films, and the interlayer insulation film.

With the miniaturization in design rules today, the exposure mask alignment margin in photolithography is determined by the alignment or mask precision of the apparatus, among other factors. It is therefore considered difficult to achieve a mask alignment margin of less than about 0.07 to 0.08 $\mu$m. The SAC method, however, is suited to increasing the integration of a semiconductor device in that the mask alignment margin can be larger.

The method disclosed in publication I (Japanese Laid-Open Patent Application H10-4190) is an example of a conventional SAC method.

FIG. 8 serves to illustrate a conventional SAC process. The SAC process in publication I will now be briefly described through reference to FIGS. 8(A) to 8(D).

As shown in FIG. 8(A), first, a gate insulation film 101 and a plurality of gate electrodes 105 having offset nitride films 103 are formed on a substrate 107. With the technique in publication I, the next step is to form side wall spacers 109 composed of silicon nitride film at the side wall 105a portions of the gate electrodes 105, as shown in FIG. 8(B). An interlayer insulation film 111 composed of a silicon oxide film, for example, is then formed, as shown in FIG. 8(C).

After this, as shown in FIG. 8(D), an etching mask 113 having openings corresponding to contact holes is formed. The interlayer insulation film 111 is then etched via this etching mask 113. As a result, just the interlayer insulation film 111 is selectively etched with respect to the silicon nitride films (the offset nitride films 103 and the side wall spacers 109). At this point there remain portions protected by the side wall spacers 109 and the offset nitride films 103. In this way contact holes 115 are formed at self-aligning positions in the interlayer insulation film 111.

Unfortunately, with the SAC method of publication I, as shown in FIG. 8(D), the offset nitride films 103 and side walls 109 are formed from silicon nitride films. Consequently, a hot carrier phenomenon tends to occur when the semiconductor elements in the semiconductor device are driven, as disclosed in publication II (T. Mizuno et al., "Hot-Carrier Injection Suppression Due to the Nitride-Oxide LDD Spacer Structure," IEEE Transactions on Electron Devices, Vol. 38, No. 3, p. 584, March 1991) or publication III (F. C. Hsu and H. R. Grinolds,. "Structure-Enhanced MOSFET Degradation Due to Hot-Electron Injection," IEEE Electron Device Letters, Vol. EDL-5, No. 3, p. 71, March 1984).

According to publications II or III, the hot carrier phenomenon tends to occur in the vicinity of the interface between the silicon oxide film and silicon nitride film (the portion circled with a broken line in FIG. 8(D)). The hot carrier phenomenon is particularly prone to occur if the silicon oxide film/silicon nitride film interface is close to the substrate. Therefore, a drawback to the semiconductor device in publication I is its large hot carrier injection.

FIG. 9 serves to illustrate an improved version of prior art. In order to suppress hot carrier injection in the technique of publication I, it is proposed, for example, that a thin oxide film be formed over the entire side wall portion of the gate electrodes 105 prior to the formation of the side wall spacers 109 composed of silicon nitride film. In the example shown in FIG. 9(A), gate electrode side wall oxide films 117a are deposited on the surface of the gate electrodes (polysilicon gate electrodes) 105 and the offset nitride films 103. In the example shown in FIG. 9(B), thin silicon oxide films 117b are formed on the side walls of the gate electrodes 105.

At the present time, however, as miniaturization is increasing due to higher integration, the gap between adjacent gate electrodes 105, for example, is already down to about 0.20 $\mu$m. Furthermore, side wall spacers need to be provided to each gate electrode. The slit gap formed between opposing side wall spacers is therefore only about 0.10 $\mu$m or less, for example. In this case, as shown in FIG. 9, it is difficult to form the contact holes 115 in self-aligning fashion, as mentioned above. Specifically, the narrow slit gap w tends to cause a phenomenon-whereby etching comes to a halt at the interlayer insulation film 111 in this fine slit portion (generally called etch stop). Thus, with the prior art shown in FIG. 9, it is difficult to form the side wall spacers 109 while ensuring a slit gap w that is wide enough to prevent etch stop. Consequently, poor contact tends to occur.

SUMMARY OF THE INVENTION

In view of this, it is an object of the present invention to provide a semiconductor device with an SAC structure, and a semiconductor device manufacturing method that makes use of an SAC method, wherein the structure of the semiconductor device and the semiconductor device manufacturing method allow the hot carrier phenomenon and the occurrence of poor contact to be suppressed.

To achieve the stated object, the semiconductor device of the present invention comprises the following unique structure. Specifically, the semiconductor device of the present invention comprises a substrate, a plurality of gate electrodes having offset nitride films and side wall spacers for forming contact holes in a self-aligning fashion, provided on the substrate via a gate insulation film, an interlayer insulation film that covers the gate electrodes, and contact holes that go through the interlayer insulation film between a plurality of gate electrodes. With the present invention, the side wall spacers are constituted from lower side wall spacers that include a silicon oxide film and are provided on the lower sides of the gate electrode side walls, and upper side wall spacers that include a silicon nitride film and are provided on the upper sides of the gate electrode side walls.

With the structure of this semiconductor device, the side wall spacers are constituted by a laminar structure of lower side wall spacers and upper side wall spacers. The upper side wall spacers and the offset nitride films function as stopper films during the formation of the contact holes. The result is a structure in which the contact holes are formed in self-aligning fashion (SAC structure).

Furthermore, since the lower side wall spacers including the silicon oxide films are provided at the lower portion of the gate electrode side walls where the hot carrier phenomenon tends to occur, the silicon oxide film/silicon nitride film interface can be sufficiently isolated from the substrate surface. Accordingly, it is possible to achieve an element structure that suppresses the hot carrier phenomenon better than the prior art shown in FIG. 8.

With this structure, there is no need to oxidize the gate electrode side walls or to deposit a silicon oxide film over the entire surface of the gate electrode side walls in order to suppress the hot carrier phenomenon, as was the case with the prior art shown in FIG. 9. Thus, there is less reduction in the width of the slits formed between mutually opposing portions of the side wall spacers provided to each of the adjacent gate electrodes. Therefore, etch stop is less likely to occur, which means that the incidence of poor contact can be reduced.

DESCRIPTION OF THE PREFERRED EMBODIMENTS

Examples of the semiconductor device and of the semiconductor device manufacturing method of the present invention will now be described through reference to the figures. The figures used in these descriptions merely schematically illustrate the shape, size, and positional relationships of the various structural components to the extent that these inventions can be understood. Identical components in the figures are labeled with the same numbers and given the same hatching, and redundant descriptions and labeling in the figures may be omitted. The materials used, numerical conditions, and so forth given below are nothing but examples in the scope included in the essence of the invention, and the present invention is not limited to these. Also, to make the figures easier to understand, there are places in the figures where the hatching indicating a cross section is omitted.

First Example

Figure 1:
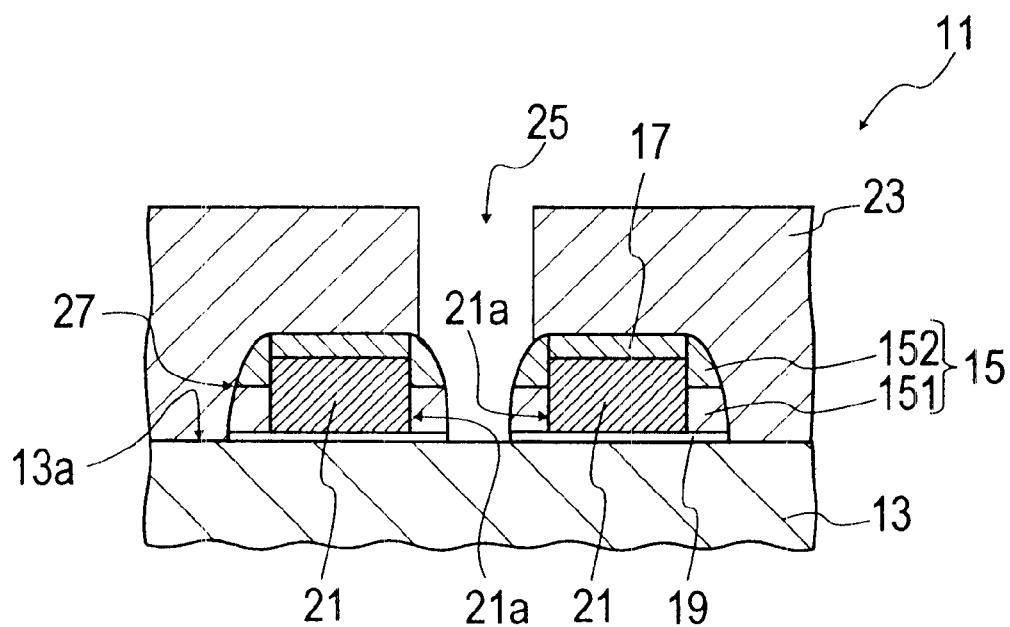
FIG. 1 is a cross sectional view schematically illustrating the semiconductor device in the first example.

FIG. 1 is a cross sectional view schematically illustrating the semiconductor device in the first example. The structure of the semiconductor device of the first example, as well as the method for manufacturing this device, will now be described through reference to FIG. 1.

As shown in FIG. 1, this semiconductor device 11 comprises a substrate 13, gate electrodes 21 that have side wall spacers (also referred to simply as side walls) 15 and offset nitride films 17 and are provided on this substrate 13 via a gate insulation film 19, an interlayer insulation film 23 that covers the gate electrodes 21, and contact holes 25 that go through the interlayer insulation film 23 between a plurality of the gate electrodes 21.

This semiconductor device 11 has a structure for forming the contact holes 25 in self-aligning fashion by means of the side wall spacers 15 and the offset nitride films 17 (SAC structure).

As shown in FIG. 1, with the semiconductor device 11 in this example, the side wall spacers 15 are characterized by consisting of lower side wall spacers 151 that are composed of silicon oxide films and are in contact with the lower side (the lower portion out of the portion along the side walls 21a in FIG. 1) of the side walls 21a of the gate electrodes 21, and upper side wall spacers 152 that are composed of silicon nitride films and are in contact with the upper side (the upper portion out of the portion along the side walls 21a in FIG. 1) of the side walls 21a of the gate electrodes 21.

In both conventional non-SAC structures and the SAC semiconductor device of this application, prior to forming the contact holes by etching, an etching mask corresponding to the openings thereof must be formed. Here, as is commonly known, the etching mask will be out of position if there is any mask misalignment, decreased mask precision, or the like in the exposure mask used to form this etching mask. Thus, the contact holes may be out of position with a conventional non-SAC semiconductor device, and as a result short-circuiting tends to occur between the contacts and gate electrodes.

However, the semiconductor device 11 in FIG. 1, which has an SAC structure, has the offset nitride films 17 and the upper side wall spacers 152, each composed of silicon nitride films, and is structured such that the contact holes 25 can be formed in self-aligning fashion. Thus, with this semiconductor device 11, because the offset nitride films 17 and the upper side wall spacers 152 function as stopper films in the formation of the contact holes 25, the contact holes 25 can be formed at self-aligning positions in the interlayer insulation film 23. Specifically, with this semiconductor device 11, even if mask misalignment, decreased mask precision, or the like should occur, contact holes 25 that reach the substrate 13 can still be formed without bringing them into contact with the gate electrodes 21. Short-circuiting is thus less likely to occur between the contacts and the gate electrodes, and the occurrence of poor contact can therefore be suppressed.

Furthermore, with this semiconductor device 11, the lower side wall spacers 151 composed of silicon oxide films are provided at the lower part of the side walls 21a of the gate electrodes 21 where the hot carrier phenomenon is most likely to occur, so the silicon oxide film/silicon nitride film interface 27 can be sufficiently isolated from the substrate surface 13a. Accordingly, it is possible to achieve an element structure that suppresses the hot carrier phenomenon better than the prior art shown in FIG. 8.

At the present time, the height of a typical gate electrode 21 is about 1500 to 2500 Å. For instance, it is preferable for the distance between the silicon oxide film/silicon nitride film interface 27 and the substrate surface 13a (that is, the film thickness of the lower side wall spacers) to be about 500 Å or even slightly more, and if it is, then the voltage will be sufficiently reduced in the vicinity of the interface 27, allowing hot carrier injection to be decreased.

Figure 9A:
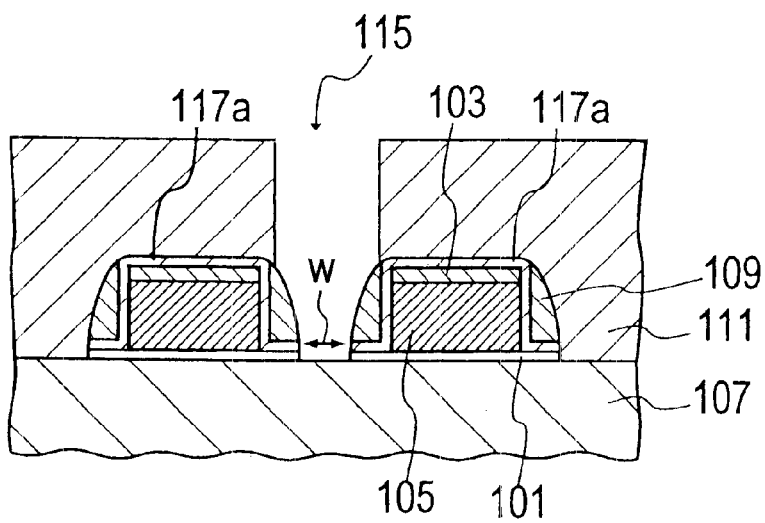
FIG. 9 (including FIGS. 9(A) and 9(B)) is a cross sectional diagram that serves to illustrate an improved version of prior art.
Figure 9B:
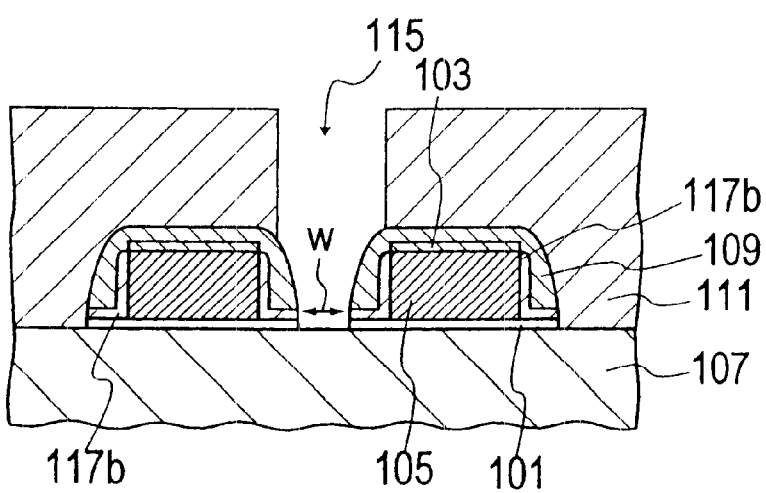

Also, with this semiconductor device 11, there is no need to oxidize the gate electrode side walls or to deposit a silicon oxide film over the entire surface of the gate electrode side walls, as was the case with the prior art shown in FIG. 9. As mentioned above, this semiconductor device 11 only has silicon oxide films at the lower part of the side walls 21a of the gate electrodes 21 as the lower side wall spacers 151. Thus, with the semiconductor device 11 in FIG. 1, there is less reduction in the width of the slits formed between mutually opposing portions of the side wall spacers 15 provided to the various side walls 21a of adjacent gate electrodes 21. Therefore, etch stop is less likely to occur, which means that the incidence of poor contact can be reduced.

With the higher integration of today's semiconductor devices, the distance between adjacent gate electrodes can sometimes be as little as about 0.20 µm. Thus, since oxide films were formed over the entire side walls of the gate electrodes with the prior art shown in FIG. 9, even if the thickness of the oxide films on the gate electrode side walls was only a few hundred angstroms, there would inevitably be a decrease in the slit gap between side wall spacers. With this semiconductor device 11, however, even if the gap between gate electrodes 21 is only about 0.20 µm, a gap of at least about 0.10 µm can be ensured between the side wall spacers 15, so the occurrence of etch stop can be suppressed.

The structure of the semiconductor device 11 in the first example described above can be obtained, for instance, by the manufacturing method of the following example.

Second Example

FIGS. 2 and 3 are manufacturing step diagrams illustrating schematic cross sections in the semiconductor device manufacturing method in the second example. The semiconductor device manufacturing method of the second example will now be described through reference to FIGS. 2 and 3.

Figure 2A:
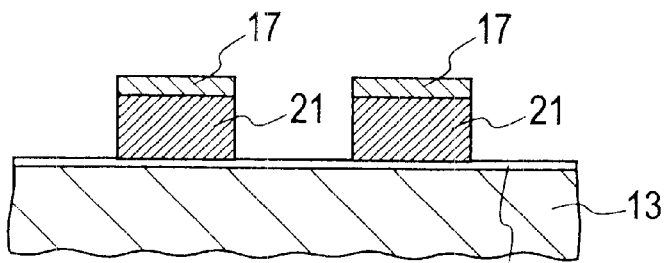
FIG. 2 (including FIGS. 2(A), 2(B), 2(C), and 2(D)) is a schematic cross sectional manufacturing step diagram of the semiconductor device manufacturing method in the second example (part 1)

As shown in FIG. 2(A), in the first step a plurality of gate electrodes 21 having a gate insulation film 19a and offset nitride films 17 are formed on the substrate 13.

A silicon oxide film, silicon nitride film, or other favorable insulating film can be used for this gate insulation film 19a, for example.

A polysilicon gate electrode or other favorable electrode forming material can be used for these gate electrodes 21, for example.

In this first step, more specifically, although not shown, after the gate insulation film 19a has been formed on the substrate 13, an electrode forming film (such as a polysilicon film) and a silicon nitride film are formed in uniform film thicknesses. Next, an etching mask is formed using photolithography with an exposure mask, after which the electrode forming film and the silicon nitride film are patterned all at once by means of this etching mask. This forms the offset nitride films 17 and the gate electrodes 21 that make up a pattern all within the same plane.

Figure 2B:
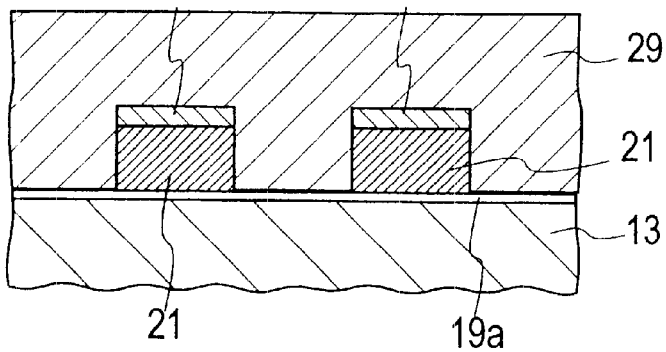

Following the first step, a silicon oxide layer 29 composed of a silicon oxide film is formed so as to cover the gate electrodes 21 and the substrate 13 in the second step, shown in FIG. 2(B). For example, in this second step, the silicon oxide layer 29 is deposited in a film thickness great enough to completely bury the steps of the gate electrodes 21.

Figure 2C:
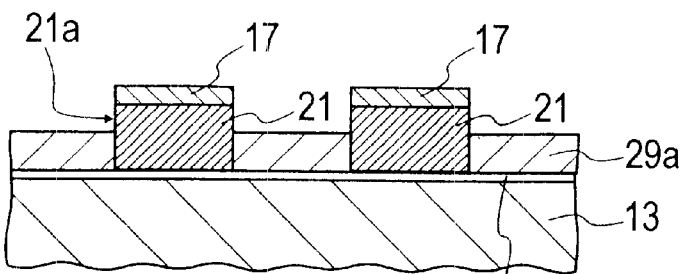

Following the second step, the silicon oxide layer 29 is etched in the third step shown in FIG. 2(C), which forms a lower side wall spacer precursor layer 29a that is thinner than the gate electrodes 21 on the lower side of the side walls 21a of the gate electrodes 21. Specifically, in this third step, the silicon oxide layer 29 is selectively etched back by utilizing the etching selectivity between the silicon oxide layer 29 and the offset nitride films 17 and gate electrodes 21 (eg, polysilicon).

Figure 2D:
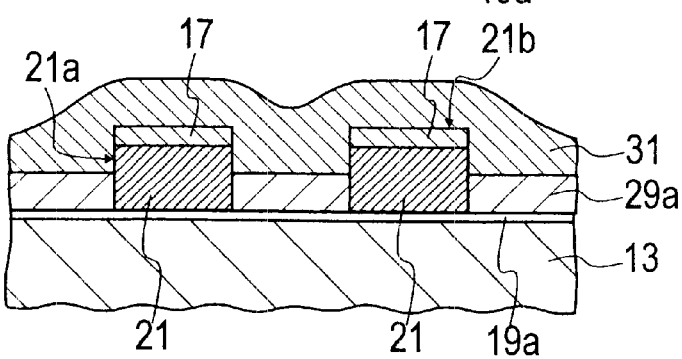

After the third step, a silicon nitride layer 31 composed of a silicon nitride film is formed so as to cover the lower side wall spacer precursor layer 29a in the fourth step shown in FIG. 2(D).

With the increasing integration of today's semiconductor devices, the gate gap is shrinking with respect to the height of the gate electrodes, and the aspect ratio of the gate electrodes 21 (the height of the gate electrodes divided by the gate electrode gap) is becoming extremely large, which is something that is well known by persons skilled in the art. As the aspect ratio increases, the film thickness deposited at the side walls 21a of the gate electrodes 21 tends to be relatively thin compared to the film thickness deposited on the upper side of the gate electrodes 21. It is therefore difficult to form the side wall spacers 15 so that the specified width is achieved in the fifth step, discussed below.

However, in the fourth step of this example, the silicon nitride layer 31 is formed after the lower side wall spacer precursor layer 29a has already been formed. Thus, a substantial reduction in the aspect ratio can be achieved in forming the silicon nitride layer 31. It is therefore easier to control the thickness of the silicon nitride layer 31 at the side walls 21a of the gate electrodes 21 and the thickness of the silicon nitride layer 31 at the upper sides 21b of the gate electrodes 21. As a result, there is the advantage that the specified width of the side wall spacers 15 can be easily achieved in the fifth step discussed below.

Figure 3A:
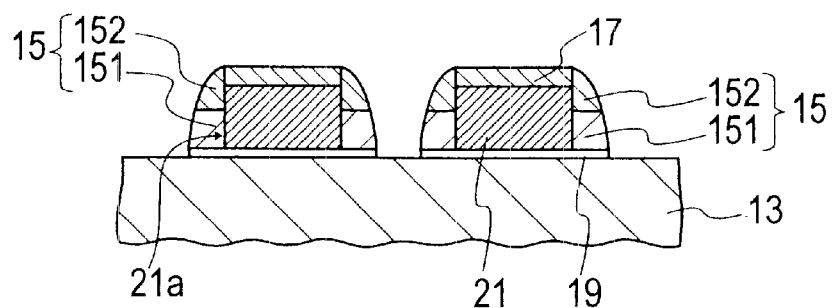
FIG. 3 (including FIGS. 3(A), 3(B), and 3(C)) is a schematic cross sectional manufacturing step diagram of the semiconductor device manufacturing method in the second example (part 2)

Following the fourth step, the silicon nitride layer 31 and the lower side wall spacer precursor layer 29a are successively etched in the fifth step shown in FIG. 3(A). This forms side wall spacers 15 consisting of upper side wall spacers 152 in which the silicon nitride films remain on the upper side (the upper portion out of the portion along the side walls 21a in FIG. 1) of the side walls 21a of the gate electrodes 21, and lower side wall spacers 151 in which the silicon oxide films remain on the lower side (the lower portion out of the portion along the side walls 21a in FIG. 1) of these side walls 21a.

As discussed above, the width of the side wall spacers 15 formed in this fifth step is determined according to just the film thickness of the silicon nitride layer 31.

Figure 3B:
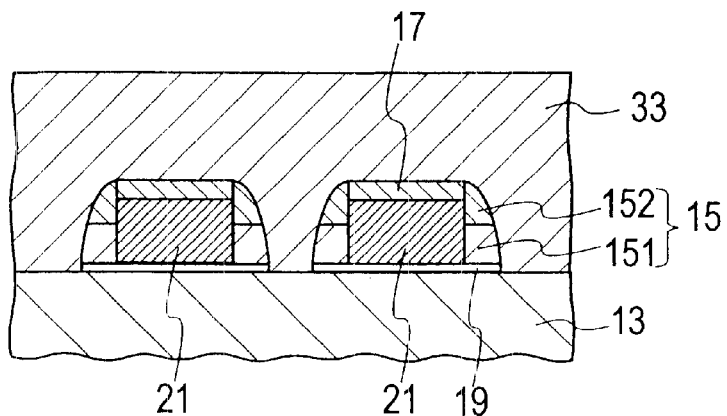

Following the fifth step, an interlayer insulation film 33 is formed in the sixth step shown in FIG. 3(B) so as to cover the gate electrodes 21 on which the side wall spacers 15 are formed.

In general, non-doped silicate glass (NSG), as well as phosphosilicate glass (PSG), boron-phosphosilicate glass (BPSG), or another silicon oxide film that can be smoothed by reflow can be used as this interlayer insulation film 33. Naturally, this interlayer insulation film 33 may also be smoothed by CMP.

Figure 3C:
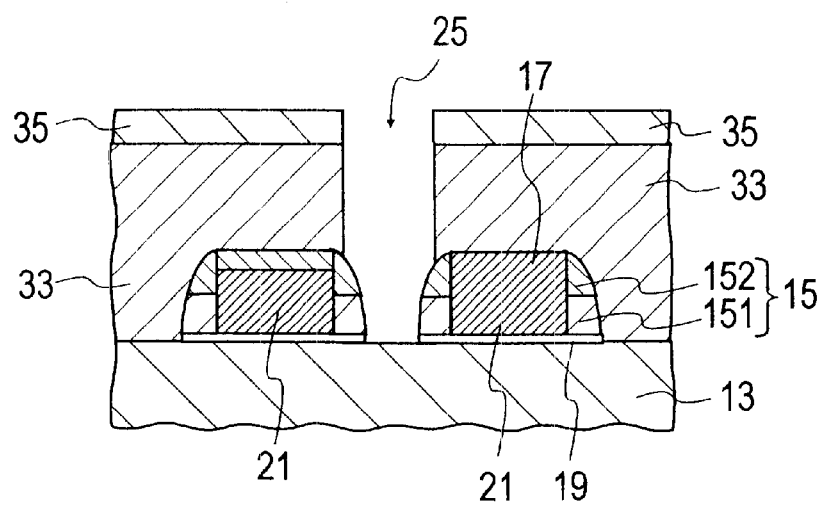

Following the sixth step, contact holes 25 that go through the interlayer insulation film 33 are formed in self-aligning fashion by etching this interlayer insulation film 33 in the seventh step shown in FIG. 3(C).

Usually, in this seventh step, an etching mask 35 is provided ahead of time using photolithography with an exposure mask on the top surface of the interlayer insulation film 33. After this, the interlayer insulation film 33 is etched to form the contact holes 25 in the open portions of the mask 35. Here, even if the mask 35 is not accurately positioned, and as a result the offset nitride films 17 and the side wall spacers 15 are exposed to the etchant, the offset nitride films 17 and the upper side wall spacers 152 will function as stopper films, substantially preventing these components from being etched. Therefore, even if the mask is out of position by a certain amount, contact holes 25 that reach the substrate 13 can still be formed without bringing them into contact with the gate electrodes 21.

Examples of the conditions under which the contact holes 25 are selectively etched and formed include $C_4F_8$ gas: 18 sccm, CO gas: 300 sccm, argon gas: 400 sccm, chamber pressure: 55 mTorr, applied power: 1300 W, and etching time: 135 seconds.

With a method for manufacturing a semiconductor device in which the contact holes 25 are formed through the above steps, the offset nitride films 17 and the upper side wall spacers 152 will function as stopper films, so the contact holes 25 can be formed at self-aligning positions in the interlayer insulation film 33. Specifically, with this method for manufacturing a semiconductor device, even if mask misalignment, decreased mask precision, or the like should occur, contact holes 25 that reach the substrate 13 can still be formed without bringing them into contact with the gate electrodes 21. Short-circuiting is thus less likely to occur between the contacts and the gate electrodes, and the occurrence of poor contact can therefore be suppressed.

Furthermore, with this method for manufacturing a semiconductor device, as shown in FIG. 1, the lower side wall spacers 151 composed of silicon oxide films are provided at the lower part of the side walls 21a of the gate electrodes 21 where the hot carrier phenomenon tends to occur, so the silicon oxide film/silicon nitride film interface 27 can be sufficiently isolated from the substrate surface 13a. Accordingly, it is possible to achieve an element structure that suppresses the hot carrier phenomenon better than the prior art shown in FIG. 8.

At the present time, the height of a typical gate electrode 21 is about 1500 to 2500 Å. For instance, it is preferable for the distance between the silicon oxide film/silicon nitride film interface 27 and the substrate surface 13a (that is, the film thickness of the lower side wall spacers) to be about 500 Å or even slightly more, and if it is, then the voltage will be sufficiently reduced in the vicinity of the interface 27, allowing hot carrier injection to be decreased (see FIG. 1).

With the method for manufacturing a semiconductor device of the second example, unlike the prior art shown in FIG. 9, there is no need to oxidize the side walls 21a of the gate electrodes 21 or to deposit a silicon oxide film over the entire surface of the side walls 21a of the gate electrodes 21. Specifically, silicon oxide films are formed here as the lower side wall spacers 151 only at the lower part of the side walls 21a of the gate electrodes 21. Thus, with the semiconductor device 11 in FIG. 1, there is less reduction in the width of the slits formed between mutually opposing portions of the various side wall spacers 15 of the adjacent gate electrodes 21. Therefore, etch stop is less likely to occur, which means that the occurrence of poor contact can be suppressed.

With the higher integration of today's semiconductor devices, the distance between adjacent gate electrodes can sometimes be as little as about 0.20 μm. Since oxide films were formed over the entire surface of the side walls of the gate electrodes with the prior art shown in FIG. 9, even if the thickness of the oxide films on the side walls of the gate electrodes was only a few hundred angstroms, there would inevitably be a decrease in the slit gap between side wall spacers. With this semiconductor device manufacturing method, however, even if the gap between gate electrodes 21 is only about 0.20 μm, a gap of at least about 0.10 μm can be ensured between the side wall spacers 15, so the occurrence of etch stop can be suppressed.

Third Example

The semiconductor device manufacturing method of the third example will now be described as a variation on the second example.

With an ordinary semiconductor device, a dense region where the gate electrodes are densely gathered and a sparse region where the gate electrodes are more scattered are formed on a substrate. The difference in the density of the gate electrodes is particularly great, for instance, between memory components and control components with a DRAM, SRAM, or other such memory. In the case of a semiconductor device with such a large difference in density, it is preferable to perform the following method for manufacturing a semiconductor device of the third example.

Figure 4:
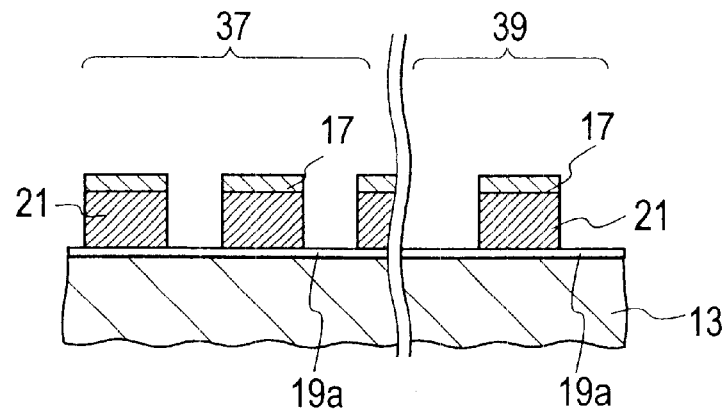
FIG. 4 (including FIGS. 4(A), 4(B), 4(C), and 4(D)) is a schematic cross sectional manufacturing step diagram of the semiconductor device manufacturing method in the third example (part 1)
Figure 4:
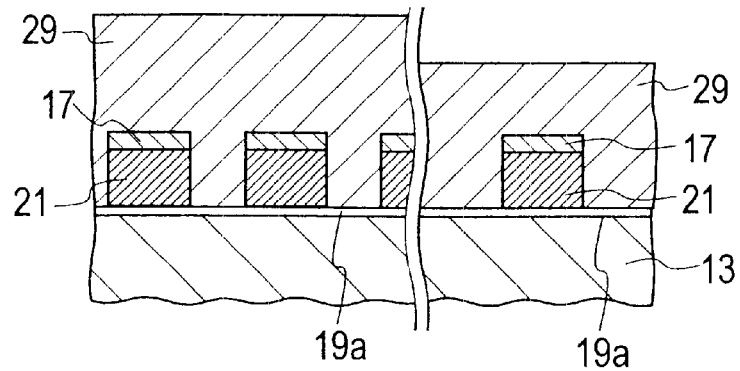
Figure 4:
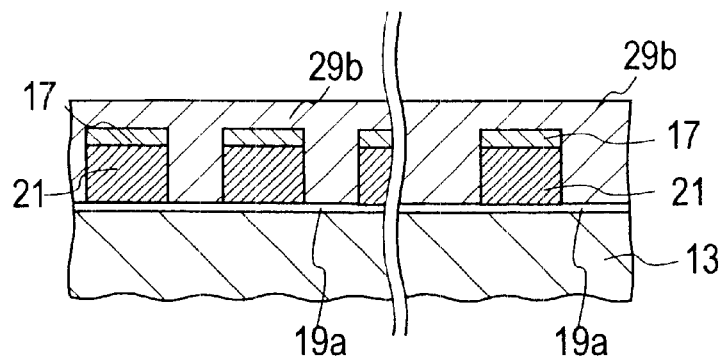
Figure 4:
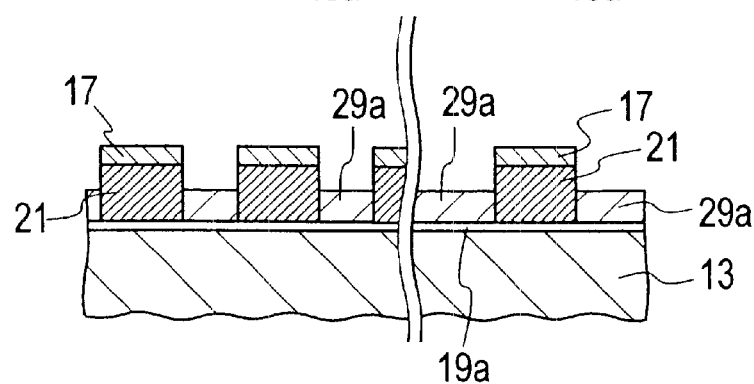

FIGS. 4 and 5 are schematic cross sectional manufacturing step diagrams of the semiconductor device manufacturing method in the third example. The semiconductor device manufacturing method of the third example will now be described through reference to FIGS. 4 and 5. Situations that are the same as in the second example, however, will not be described again.

As shown in FIG. 4(A), in the first step of the third example, a plurality of gate electrodes are formed on the substrate 13 so as to constitute a dense region 37 where the gate electrodes 21 are densely gathered and a sparse region 39 where the gate electrodes 21 are more scattered. This first step may be the same as in the second example.

As is well known, the gate electrodes in an ordinary semiconductor device are formed not uniformly, but with a certain amount of difference in density. This difference in density is particularly pronounced in the case of a memory element such as a DRAM, in which the gate electrode spacing is narrowest in the memory components where semiconductor elements are arranged in a matrix, and the gate electrode spacing is relatively wide in other portions such as control components.

Following the first step, a silicon oxide layer 29 composed of a silicon oxide film is formed so as to cover the gate electrodes 21 and the substrate 13 in the second step, shown in FIG. 4(B).

In the second step, as shown in FIG. 4(B), the films are formed thicker in the dense region 37 of the silicon oxide layer 29 than in the sparse region 39, which is attributable to the difference in gate electrode density. For instance, in this second step, the silicon oxide layer 29 is deposited in a film thickness great enough to completely bury the steps of the gate electrodes 21 in the dense region 37 and sparse region 39.

It comes as no surprise that the film thickness in the dense region 37 is thus be greater than the film thickness in the sparse region 39, but in a typical example the height of the gate electrodes 21 is about 1500 to 2500 Å, and when the film thickness in the dense region 37 is about 8000 Å, the films in the sparse region 39 end up being extremely thin (3500 Å). This difference in film thickness is 2 to 2.5 times the height of the gate electrodes 21. Accordingly, in the third step discussed below, when the lower side wall spacer precursor layer 29a is merely formed thinner than the gate electrodes 21 of the dense region 37, the silicon oxide film (the lower side wall spacer precursor layer) will be completely removed at the side walls 21a of the gate electrodes 21 in the sparse region 39. Therefore, the hot carrier injection cannot be suppressed in the sparse region 39 in this case.

In view of this, in this third example a chemical-mechanical polishing (CMP) step, in which the silicon oxide layer 29 that has undergone the second step is broadly smoothed by CMP, is performed prior to the third step as shown in FIG. 4(C).

For instance, in this CMP step, a silicon oxide layer 29b whose film thickness has been evened out is formed by polishing the silicon oxide layer 29 such that the film thickness will be even between the dense region 37 and the sparse region 39. This allows etch-back to be performed on the silicon oxide layer 29b of evened film thickness in the third step.

Following this CMP step, the lower side wall spacer precursor layer 29a, which is thinner than the gate electrodes 21, is formed on the lower side of the side walls 21a of the gate electrodes 21 by etching the silicon oxide layer 29b (silicon oxide layer whose film thickness has been evened out) in the third step shown in FIG. 4(D). This third step can be carried out in the same manner as the third step in the second example.

In this third step, because the film thickness of the silicon oxide layer 29 formed in the second step has already been made uniform in the CMP step, as shown in FIG. 4D, the lower side wall spacer precursor layer can be formed in a uniform film thickness in the dense region 37 and sparse region 39.

Figure 5A:
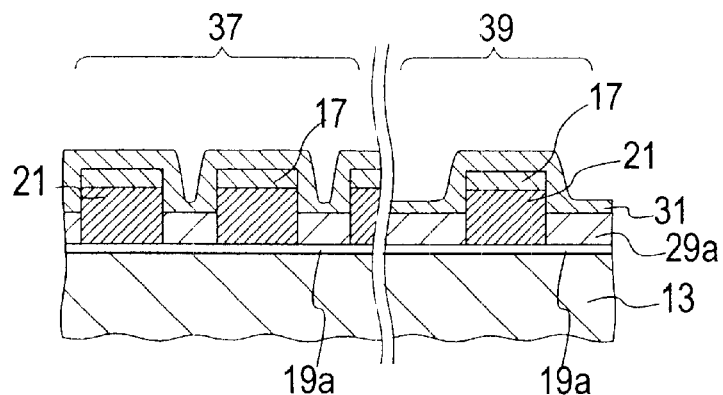
FIG. 5 (including FIGS. 5(A), 5(B), 5(C), and 5(D)) is a schematic cross sectional manufacturing step diagram of the semiconductor device manufacturing method in the third example (part 2)

After the third step, the silicon nitride layer 31 composed of a silicon nitride film is formed so as to cover the lower side wall spacer precursor layer 29a in the fourth step shown in FIG. 5(A). This fourth step can be carried out in the same manner as the fourth step in the second example.

Figure 5B:
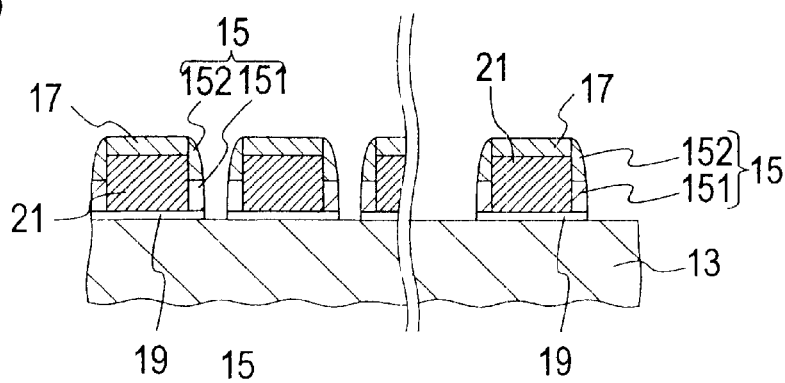

Following the fourth step, the silicon nitride layer 31 and the lower side wall spacer precursor layer 29a are successively etched in the fifth step shown in FIG. 5(B). This forms side wall spacers 15 consisting of upper side wall spacers 152 in which the silicon nitride films remain on the upper side of the side walls 21a, and lower side wall spacers 151 in which the silicon oxide films remain on the lower side of these side walls 21a. This fifth step can be carried out in the same manner as the fifth step in the second example.

In this fifth step, the film thicknesses of the lower side wall spacers 151 and the upper side wall spacers 152 are uniform in the dense region 37 and sparse region 39 because the film thickness of the silicon oxide layer 29 has been made uniform in the CMP step.

Figure 5C:
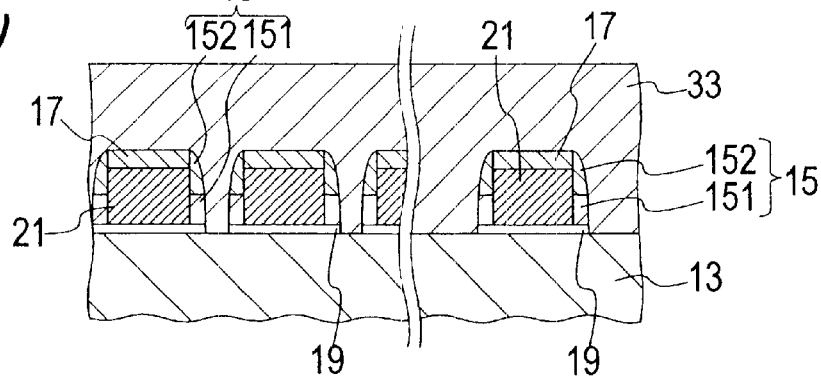

Following the fifth step, an interlayer insulation film 33 is formed in the sixth step shown in FIG. 5(C) so as to cover the gate electrodes 21 on which the side wall spacers 15 are formed. This sixth step can be carried out in the same manner as the sixth step in the second example.

Figure 5D:
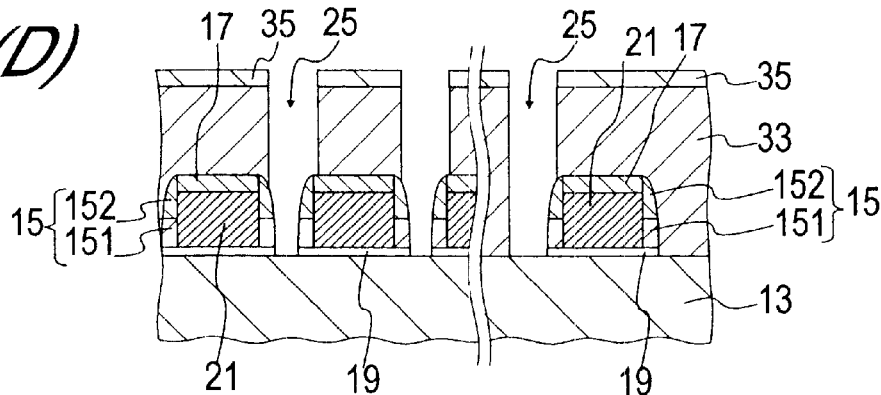

Following the sixth step, contact holes 25 that go through the interlayer insulation film 33 are formed in self-aligning fashion by etching this interlayer insulation film 33 in the seventh step shown in FIG. 5(D). This seventh step can be carried out in the same manner as the seventh step in the second example.

The semiconductor device manufacturing method of the third example described above provides the same effect as that described for the second example. Here, since a CMP step is performed before the third step in particular, even in the manufacture of a semiconductor device in which the gate electrodes 21 comprise a dense region 37 and a sparse region 39, the film thickness of the silicon oxide layer 29 is evened out in the CMP step ahead of time, and the evened silicon oxide layer 29b is etched back in the third step. Accordingly, the film thicknesses of the lower side wall spacers 151 and upper side wall spacers 152 can be made uniform in the dense region 37 and sparse region 39. This allows the hot carrier injection to be suppressed in both the dense region 37 and the sparse region 39.

Fourth Example

This fourth example is a variation on the semiconductor device manufacturing method of the second example.

The semiconductor device manufacturing method of the fourth example is similar to the third example in that it is preferably employed for a semiconductor device in which there is a large difference in the density of the gate electrodes.

FIGS. 6 and 7 are schematic cross sectional manufacturing step diagrams of the semiconductor device manufacturing method in the fourth example. The semiconductor device manufacturing method of the fourth example will now be described through reference to FIGS. 6 and 7. Situations that are the same as in the second or third example, however, will not be described again.

Figure 6A:
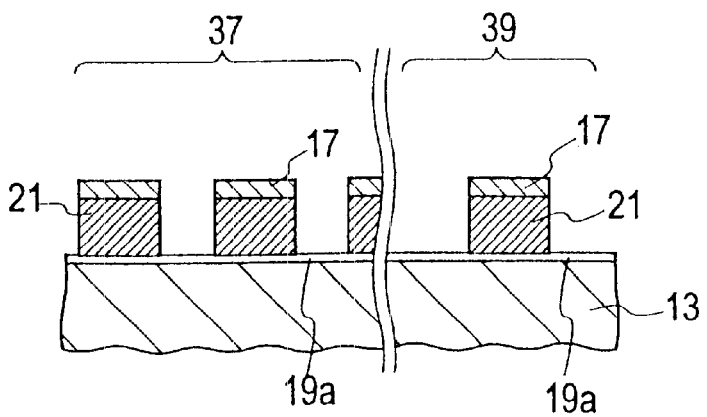
FIG. 6 (including FIGS. 6(A), 6(B), 6(C), and 6(D)) is a schematic cross sectional manufacturing step diagram of the semiconductor device manufacturing method in the fourth example (part 1)

As shown in FIG. 6(A), in the first step of the fourth example, a plurality of gate electrodes are formed on the substrate 13 so as to constitute a dense region 37 where the gate electrodes 21 are densely gathered and a sparse region 39 where the gate electrodes 21 are more scattered. This first step can be carried out in the same manner as the first step in the second example.

Figure 6B:
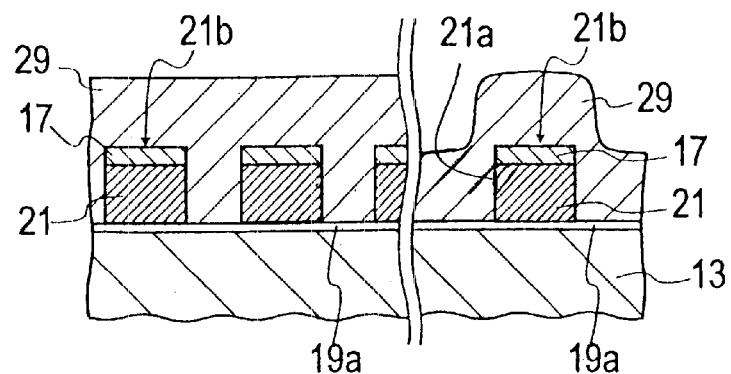

Following the first step, a silicon oxide layer 29 composed of a silicon oxide film is formed so as to cover the gate electrodes 21 and the substrate 13 in the second step, shown in FIG. 6(B).

In this fourth example, though, in forming the silicon oxide layer 29 in the second step, the film formation material or conditions are set and the silicon oxide layer 29 is formed so that the s pace between the gate electrodes 21 in the dense region 37 will be filled in and the film thickness on the upper side 21b of the gate electrodes 21 in the sparse region 39 will be greater than the film thickness at the side walls 21a of the gate electrodes 21 in the sparse region 39.

Specifically, in this second step, the silicon oxide layer 29 is formed after the film formation material or conditions are purposely selected so that the step coverage characteristics will be poor. Consequently, as shown in FIG. 6(B), in the sparse region 39, for instance, the gate electrodes 21 are independent, so the silicon oxide layer 29 at the side walls 21a of the gate electrodes 21 is thinner than the silicon oxide layer 29 at the upper sides 21b of the gate electrodes 21. The silicon oxide layer 29 at the upper sides 21b of the gate electrodes 21 in the dense region 37 is substantially the same thickness as the silicon oxide layer 29 at the upper sides 21b of the gate electrodes 21 in the sparse region 39. Furthermore, since the gate electrodes 21 are densely gathered in the dense region 37, the space between the gate electrodes 21 can be filled in by the silicon oxide layer 29.

It is preferable to use PSG, BPSG, P-TEOS·NSG, or P-SiH$_4$ ·NSG, for example, as the material for forming this silicon oxide layer 29.

The film thickness of the dense region 37 and sparse region 39 can be easily controlled for these film forming materials because their characteristics such as step coverage are thoroughly understood.

As to the film thickness of the silicon oxide layer 29, in the dense region 37, for example, the silicon oxide layer 29 is formed thick enough that there will be no steps produced by the gate electrodes 21 on the surface of the silicon oxide layer 29, and in the sparse region 39, the silicon oxide layer 29 is deposited thin enough that steps produced by the gate electrodes 21 will remain on the surface of the silicon oxide layer 29.

The degradation in step coverage in the sparse region 39 is utilized in this fourth example, so the third step discussed below is carried out immediately after the second step, without a reflow or CMP process being performed for the purpose of smoothing out the silicon oxide layer.

Figure 6C:
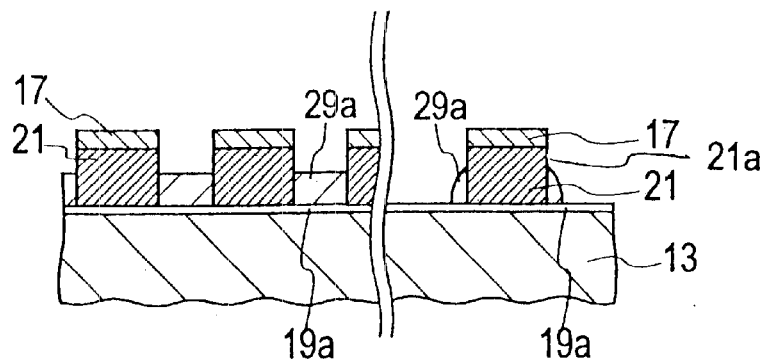

Following the second step, a lower side wall spacer precursor layer 29a that is thinner than the gate electrodes 21 is formed by etching the silicon oxide layer 29 in the third step shown in FIG. 6(C). Specifically, in this third step, the silicon oxide layer 29 is selectively etched back by utilizing the etching selectivity between the silicon oxide layer 29 and the offset nitride films 17 and gate electrodes 21 (such as polysilicon).

In the third step of the fourth example, however, since a specific film forming material or conditions are selected, as shown in FIG. 6(C), the silicon oxide layer 29 is allowed to remain behind such that the film thickness at the side walls 21a of the gate electrodes 21 in the dense region 37 is greater than the film thickness at the side walls 21a of the gate electrodes 21 in the sparse region 39. Specifically, the lower side wall spacer precursor layer 29a in contact with the gate electrodes 21 in the dense region 37 is formed thicker, and the lower side wall spacer precursor layer 29a in contact with the gate electrodes 21 in the sparse region 39 is formed thinner.

Figure 6D:
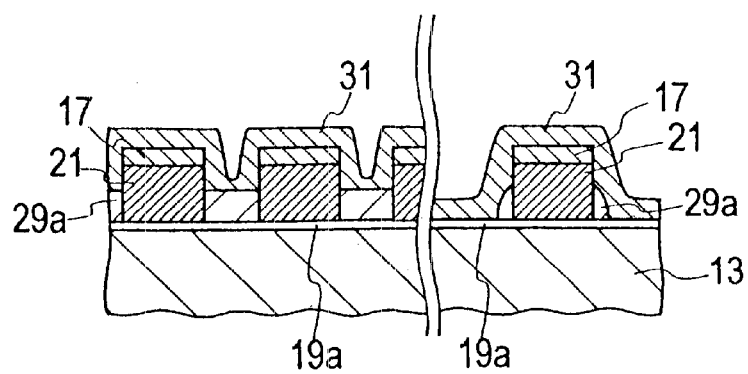

After the third step, a silicon nitride layer 31 composed of a silicon nitride film is formed so as to cover the lower side wall spacer precursor layer 29a in the fourth step shown in FIG. 6(D). This fourth step can be carried out in the same manner as the fourth step in the second example.

Figure 7A:
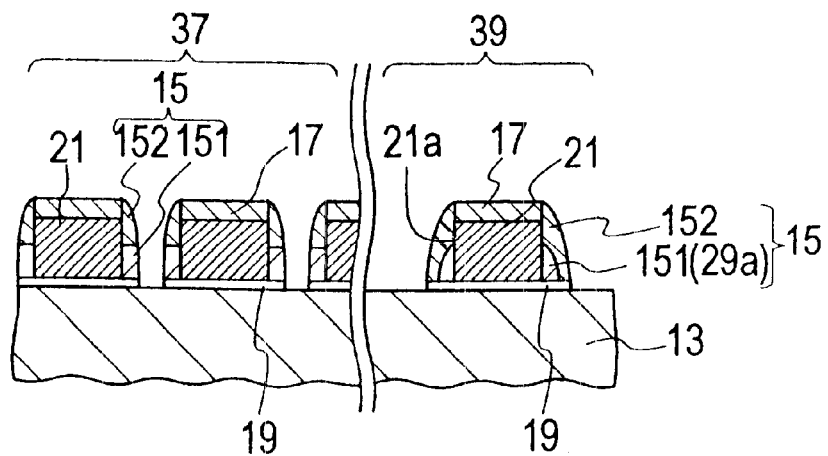
FIG. 7 (including FIGS. 7(A), 7(B), and 7(C)) is a schematic cross sectional manufacturing step diagram of the semiconductor device manufacturing method in the fourth example (part 2)

Following the fourth step, in the fifth step shown in FIG. 7(A), side wall spacers 15 consisting of upper side wall spacers 152 in which the silicon nitride-films remain on the upper side of the side walls 21a, and lower side wall spacers 151 in which the silicon oxide films remain on the lower side of these side walls 21a are formed by successively etching the silicon nitride layer 31 and the lower side wall spacer precursor layer 29a.

Still, because the width of the side wall spacers 15 formed in the fifth step of this fourth example is different from the width of the lower side wall spacer precursor layer 29a as mentioned above, they can be thin in the dense region 37 and thick in the sparse region 39.

Figure 7B:
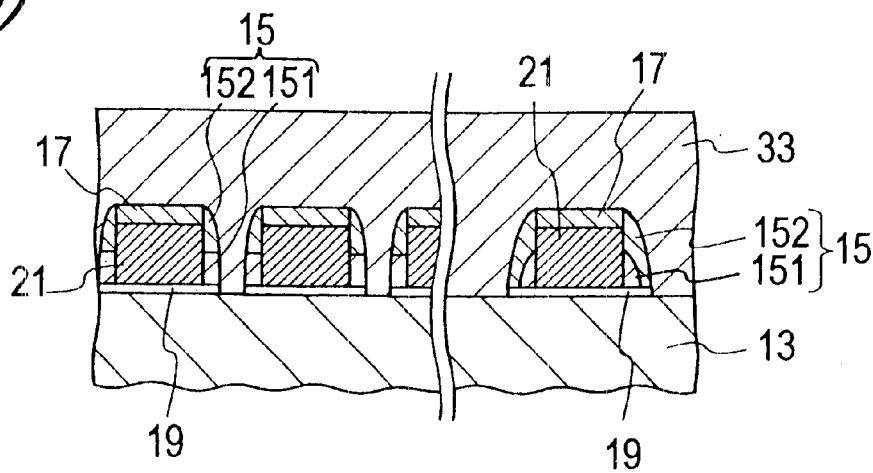

Following the fifth step, an interlayer insulation film 33 is formed in the sixth step shown in FIG. 7(B) so as to cover the gate electrodes 21 on which the side wall spacers are formed. This sixth step can be carried out in the same manner as the sixth step in the second example.

Figure 7C:
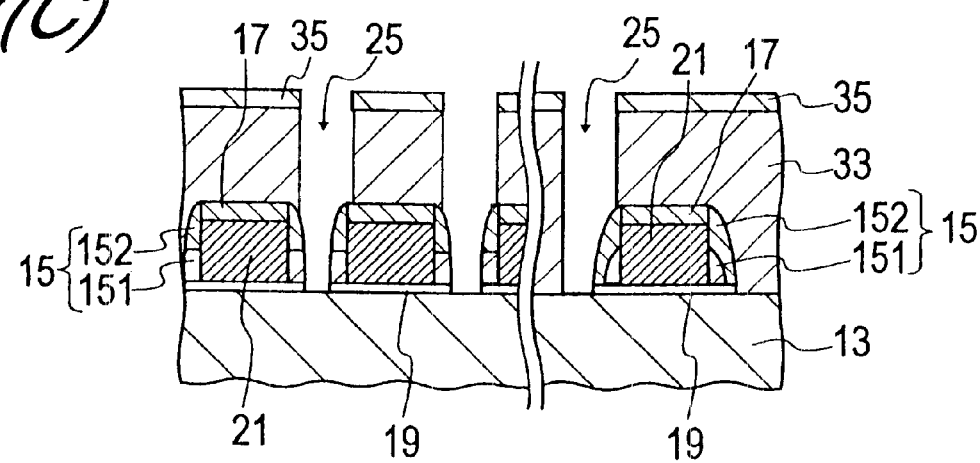
Figure 8A:
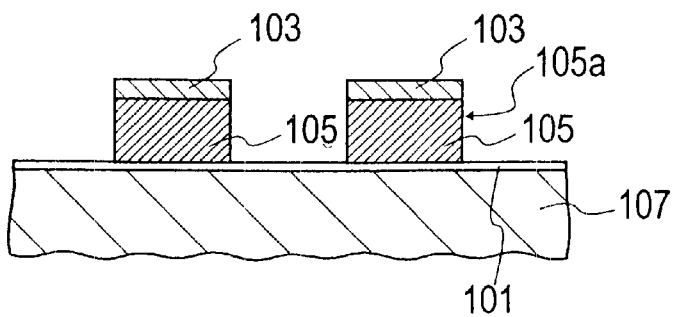
FIG. 8 (including FIGS. 8(A), 8(B), 8(C), and 8(D)) is a cross sectional diagram that serves to illustrate a conventional SAC process.
Figure 8B:
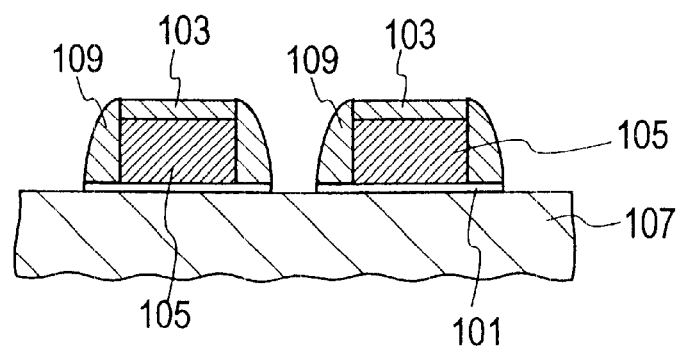
Figure 8C:
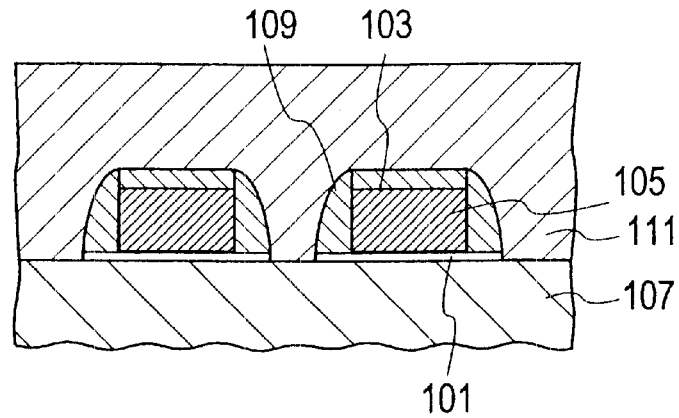
Figure 8D:
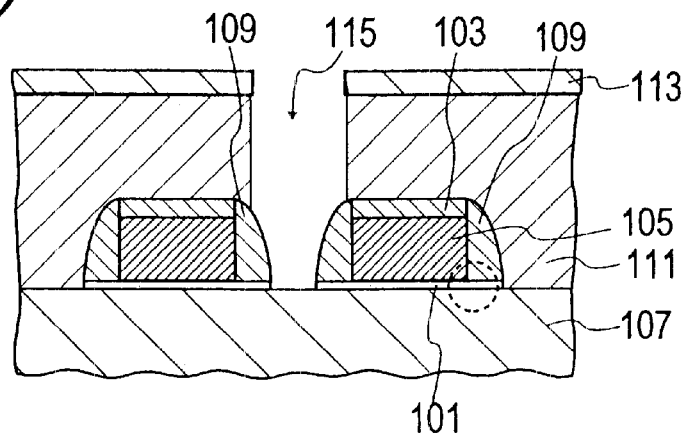

Following the sixth step, contact holes 25 that go through the interlayer insulation film 33 are formed in self-aligning fashion by etching this interlayer insulation film 33 in the seventh step shown in FIG. 7(C). This seventh step can be carried out in the same manner as the seventh step in the second example.

The semiconductor device manufacturing method of the fourth example described above provides the same effect as that described for the second example. Here, since the silicon oxide layer 29 is formed after a film forming material or conditions with poor step coverage characteristics is or are selected in the second step in particular, the width of the side wall spacers 15 can be different in the dense region 37 and in the sparse region 39. Therefore, with the semiconductor device manufacturing method in this fourth example, the characteristics of the semiconductor elements can be made different in the dense region 37 and sparse region 39, or these characteristics can be independently controlled in the dense region 37 and sparse region 39.

As is clear from the above descriptions, with the semiconductor device of the present invention, the side wall spacers consist of upper side wall spacers and lower side wall spacers, so even though an SAC structure is used, the hot carrier phenomenon and the occurrence of poor contact can both be suppressed.

With another semiconductor device of the present invention, the side wall spacers consist of upper side wall spacers composed of a silicon nitride film, and lower side wall spacers composed of a silicon oxide film, which allows the hot carrier phenomenon to be suppressed.

With the semiconductor device manufacturing method of the present invention, the structure of the side wall spacers is formed as a laminated structure comprising lower side wall spacers including a silicon oxide film and upper side wall spacers including a silicon nitride film, so even though an SAC method is employed, the hot carrier phenomenon and the occurrence of poor contact can both be suppressed.

What is claimed is:

1. A semiconductor device, comprising:
   a substrate;
   a plurality of gate electrodes, having offset nitride films and side wall spacers for forming contact holes in a self-aligning fashion, provided on a gate insulation film over said substrate;
   an interlayer insulation film that covers said gate electrodes; and
   contact holes formed through said interlayer insulation film between said plurality of gate electrodes,
   the side wall spacers including lower side wall spacers formed of a silicon oxide film on lower side walls of the plurality of gate electrodes, and upper side wall spacers formed of a silicon nitride film on upper side wall of the plurality of gate electrodes,
   said substrate including a dense region where said plurality of gate electrodes are densely located and a sparse region where said plurality of gate electrodes are scattered,
   a film thickness of said lower side wall spacers in said dense region being greater than a film thickness of said lower side wall spacers in said sparse region.

2. A semiconductor device according to claim 1, said lower side wall spacers being provided in a state of contact with the lower side walls of said plurality of gate electrodes, and said upper side wall spacers being provided in a state of contact with the upper side walls of said plurality of gate electrodes.

3. A semiconductor device according to claim 1, said lower side wall spacers having a thickness at an interface between the silicon oxide film forming said lower side wall spacers and the silicon nitride film forming said upper side wall spacers, so that a distance between said interface and said substrate is such that no hot carrier phenomenon will occur.

4. A semiconductor device comprising:

a substrate; and gate electrodes, having side wall spacers, provided on said substrate, said side wall spacers comprising lower side wall spacers formed of a silicon oxide film on lower side walls of the gate electrodes, and upper side wall spacers formed of a silicon nitride film on upper side walls of the gate electrodes, said substrate including a dense region where said gate electrodes are densely located and a sparse region where said gate electrodes are scattered, and a film thickness of said lower side wall spacers in said dense region being greater than a film thickness of said lower side wall spacers in said sparse region.

5. A semiconductor device according to claim 4, said lower side wall spacers being provided in a state of contact with the lower side walls of said gate electrodes, and said upper side wall spacers being provided in a state of contact with the upper side walls of said gate electrodes.

6. A semiconductor device according to claim 4, said lower side wall spacers having a thickness at an interface between the silicon oxide film forming said lower side wall spacers and the silicon nitride film forming said upper side wall spacers, so that a distance between said interface and said substrate is such that no hot carrier phenomenon will occur.

7. A semiconductor device, comprising:

a substrate;

first and second gate electrodes formed on the substrate;

a first region in which the first gate electrodes are formed;

a second region in which the second gate electrodes are formed, a density of the first gate electrodes with respect to area of the first region being greater than a density of the second gate electrodes with respect to area of the second region;

first side walls formed on the substrate and in contact with the first gate electrodes;

second side walls formed on the substrate and in contact with the second gate electrodes;

an interlayer insulation film that covers the first and second gate electrodes and the first and second side walls;

a first contact hole formed in the interlayer insulation film and between the first gate electrodes; and a second contact hole formed in the interlayer insulation film and between the second gate electrodes, the first side walls each comprising a first lower side wall that is a silicon oxide film and a first upper side wall that is a silicon nitride film, the second side walls each comprising a second lower side wall that is a silicon oxide film and a second upper side wall that is a silicon nitride film, wherein a thickness of the first lower side walls are greater than a thickness of the second lower side walls.

8. A semiconductor device according to claim 7, further comprising nitride films formed on the first and second gate electrodes.

9. A semiconductor device according to claim 7, wherein interfaces between the first lower side walls and the first upper side walls are located a distance above a surface of the substrate so that no hot carrier phenomenon will occur.

10. A semiconductor device according to claim 7, wherein interfaces between the second lower side walls and the second upper side walls are located a distance above a surface of the substrate so that no hot carrier phenomenon will occur.

11. A semiconductor device according to claim 7, wherein one of the first and second lower side walls have a thickness more than one-fifth a thickness of the first and second gate electrodes, respectively.

* * * * *